United States Patent [19]

Deter

[11] 4,157,522

[45] Jun. 5, 1979

[54] ELECTRICAL MELTING FUSE COMBINED WITH A PELTIER ELEMENT

[75] Inventor: Burkhard Deter, Ottobrunn, Fed. Rep. of Germany

[73] Assignee: Messerschmitt-Bolkow-Blohm G.m.b.H., Munich, Fed. Rep. of Germany

[21] Appl. No.: 848,901

[22] Filed: Nov. 7, 1977

[30] Foreign Application Priority Data

Nov. 18, 1976 [DE] Fed. Rep. of Germany ....... 2652495

[51] Int. Cl.² .......................................... H01H 85/00
[52] U.S. Cl. ........................................ 337/4; 337/167
[58] Field of Search .................. 337/4, 166, 167, 182, 337/183, 206, 241

[56] References Cited

U.S. PATENT DOCUMENTS

| 2,672,542 | 3/1954 | Fisher | 337/167 X |
| 3,340,430 | 9/1967 | Jenkins | 337/206 X |

*Primary Examiner*—George Harris
*Attorney, Agent, or Firm*—W. G. Fasse; D. F. Gould

[57] ABSTRACT

The present electrical melting fuse is current flow direction responsive. For this purpose the melting conductor is in heat exchange contact with a surface of a Peltier element which surface changes its temperature in response to a change in the flow direction of an electrical current through the Peltier element.

6 Claims, 1 Drawing Figure

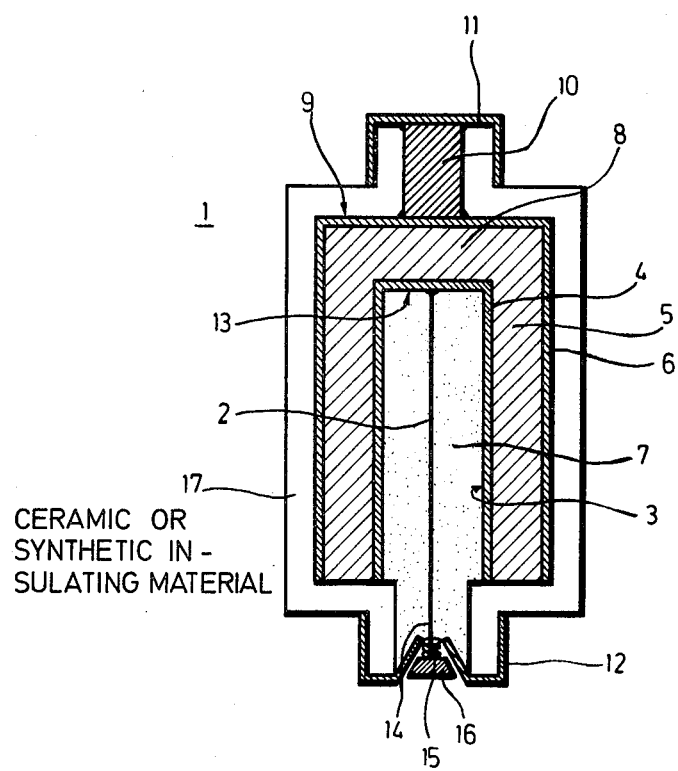

ELECTRICAL MELTING FUSE COMBINED WITH A PELTIER ELEMENT

BACKGROUND OF THE INVENTION

The present invention relates to an electrical melting fuse for direct current circuits. This type of fuse has a response characteristic which depends on the flow direction of the electrical current. Fuses having such a current direction response characteristic are, for example, needed in the power supply network of vehicles, vessels, and/or aircraft. Such fuses are capable of providing a selective safety circuit breaker for the individual circuits in a direct current power supply network.

It is known to employ for the above purpose circuit breakers which are sensitive to a reverse current flow. It is also known to use parallel circuit paths provided with melting fuses responsive to different loads and arranged to cooperate with blocking diodes, the forward flow direction of which is opposite to the current flow direction in the respective circuit path. Circuit breakers of this type have relatively involved structural features as compared to simple melting fuses. However, simple melting fuse have the disadvantage when used for the mentioned purpose, that a relatively high and frequently not tolerable voltage drop occurs across the blocking diodes connected for cooperation with such melting fuses.

OBJECTS OF THE INVENTION

In view of the above, it is the aim of the invention to achieve the following objects, singly or in combination:

to provide a current flow direction responsive melting fuse which has a relatively simple and hence inexpensive structure and which avoids the disadvantages of the prior art as outlined above;

to provide an electrical melting fuse which takes advantage of the Peltier effect and does not require a blocking diode, thereby avoiding the voltage drop across such diode;

to construct an electrical melting fuse in such a manner that it may easily be used in circuit arrangements in which different types of fuses have been used previously; and to construct a fuse employing a Peltier element and having a configuration easily adapted to various purposes, for example, the shape of the fuse may be tubular or of the layered type construction.

SUMMARY OF THE INVENTION

According to the invention there is provided an electrical melting fuse wherein the fuse conductor or wire is arranged in a heat transfer contact with a surface which changes its temperature in response to the change of the current flow direction, such as the surface of a Peltier element, which is connected in series with the melting wire of the fuse.

According to a preferred embodiment the Peltier element is shaped as a tubular body which receives the fuse wire. The tubular body may have a bottom which closes one end of the tubular bottom. The outside of the tubular bottom is connected by respective contact means to one end of the conductor in which the fuse is supposed to be operable. The other end of the conductor is connected also through suitable contact means to the free end of the melting wire, the inner end of which is electrically connected and secured to the inner surface of the bottom of the tubular body.

BRIEF FIGURE DESCRIPTION

In order that the invention may be clearly understood, it will now be described, by way of example, with reference to the FIGURE of the accompanying drawings which shows a sectional view through a tubular type of fuse.

DETAILED DESCRIPTION OF PREFERRED EXAMPLE EMBODIMENTS

The FIGURE shows a schematic somewhat simplified sectional view longitudinally through the melting fuse 1 having a melting wire or fuse wire 2 arranged in a good heat conducting contact with a surface 3 of a Peltier element. The surface 3 changes its temperature in response to the direction of current flow through the Peltier element since the surface 3 is part of one electrode 4 of the Peltier element which also comprises a semi-conductor 5 and a further electrode 6. The semi-conductor may be of the PNP or the NPN type. Depending on the conductivity type of the semi-conductor 5 and on the direction of current flowing through the layers of the Peltier element the surface 3 may heat up or it may be cooled. The change in temperature is transmitted to the melting wire 2 because the latter is in intimate heat transmittal contact with the surface 3, for example, through an electrically insulating, but heat conducting filler material 7. Such filler materials are well known in the art and are used, for example, also in so-called slow response melting fuses.

In the illustrated embodiment of the invention the Peltier element 4, 5, 6, has the shape of a tubular body, one end of which is closed by the bottom 8 having an outwardly facing surface 9 and an inwardly facing surface 13. The outwardly facing surface 9 is electrically connected through a conductor bridge element 10 to an electrical contact bushing 11. This bushing 11 has a shape to fit into conventional fuse receptacles. The melting wire 2 is connected in an electrically conducting manner to the inner surface 13 of the bottom 8 of the Peltier element. The opposite, free end 14 of the melting wire 2 is electrically connected through a spring 15 and an indicator member 16 to a contact bushing 12 also shaped to fit into a conventional fuse receptacle. Thus, there is provided a series connection from the contact bushing 11, the metal bridge 10, the Peltier element, the wire 2 and the spring 15 to the second bushing 12.

The Peltier element 4, 5, 6, is suitably encased in an electrically insulating housing 17 made of ceramic or synthetic insulating material. The shape of the housing 17 will correspond to the shape of conventional fuses, so as to fit into conventional fuse receptacles. Thus, the present fuses may be installed in any prior art type of circuit or power supply system. Thus, it is the advantage of the invention that it is possible to provide a conventional power supply system with a current direction responsive circuit breaker characteristic even if such a feature was not initially available in the system. This may be accomplished by simply exchanging the conventional fuses by the present fuses.

The present fuses may have different configurations. For example, the fuse may have a uniform diameter from the bushing 11 to the bushing 12 to provide a so-called "soffit" type of fuse.

In an alternative configuration the entire fuse may have a sandwich type, flat construction in which the components of the Peltier element form the sandwich and the wire 2 is in intimate contact with one surface of the sandwich type Peltier element. The tubular type of fuses preferably employ a tubular Peltier element which is open at both ends, whereby the melting wire 2 would be electrically connected to one end of the inner wall of the tubular Peltier element, whereas the opposite or outer tubing of the Peltier element would be connected to the bushing 11 much in the manner shown in the present FIGURE or the bushing 11 could be directly connected to the outer tubing of the Peltier element. Incidentally, with regard to the sandwich type of shape, it is desirable to place a thin layer or foil of mica between the wire 2 and the heated, substantially rectangular surface of a flat Peltier element, except for the point of electrical contact.

As mentioned, a good thermal contact between the inner surface 3 of the Peltier electrode 4 and the melting wire 2 may be accomplished by filling the inner tubular electrode of the Peltier element with an electrical insulator 7 which has a good thermal conductivity, for example, may be used for this purpose.

In prior art slow response melting wire fuses the exact response point of time of the fuse depends substantially only on the heat-up of the insulator in the area of the melting wire. This heat-up again depends substantially only on the temperature of the melting wire and the temperature of the environment. Contrary to this type of conventional fuse, the fuse according to the invention has a response temperature additionally influenced by the heating or cooling of the surface area of the Peltier element surrounding the melting wire 2, whereby an additional delay may be achieved which is current flow direction responsive.

Incidentally, the indicator member 16 will show whether or not the fuse is still operable, or whether it must be replaced as it is conventional.

Although the invention has been described with reference to specific example example embodiments, it will be appreciated, that it is intended to cover all modifications and equivalents within the scope of the appended claims.

What is claimed is:

1. An electrical melting fuse, comprising a melting conductor and a Peltier element having surface means which change their temperature in response to a change in the current flow direction through said Peltier element and means electrically connecting said melting conductor in series with said Peltier element, said melting conductor being arranged in intimate heat transfer contact with said surface means of said Peltier element.

2. The fuse of claim 1, wherein said Peltier element comprises a tubular body, said melting conductor being located in said tubular body.

3. The fuse of claim 2, wherein said tubular body of said Peltier element comprises bottom means at one end of said tubular body, said bottom means having an outer side and an inner side, contact means operatively connected to the outer side of said bottom means, said melting conductor being electrically connected with one end thereof to said inner side of said bottom means, further contact means electrically insulated from said Peltier element, and means electrically connecting the other end of said melting conductor to said further contact means.

4. The fuse of claim 1, further comprising electrical insulating means having a good thermal conductivity, said melting conductor being embedded in said electrical insulating means which contact said surface means of said Peltier element.

5. The fuse of claim 1, further comprising housing means of electrically insulating material, said Peltier element being contained in said housing means, first and second electrical contact means secured to said housing means, said melting conductor being connected to said first electrical contact means and to said Peltier element, said Peltier element being connected to said second contact means.

6. The fuse of claim 5, further comprising indicator means operatively connected to said melting conductor to display the working condition of the fuse.

* * * * *